United States Patent
Priel et al.

(10) Patent No.: US 8,970,283 B2
(45) Date of Patent: Mar. 3, 2015

(54) SWITCHING ARRANGEMENT, INTEGRATED CIRCUIT COMPRISING SAME, METHOD OF CONTROLLING A SWITCHING ARRANGEMENT, AND RELATED COMPUTER PROGRAM PRODUCT

(75) Inventors: Michael Priel, Netanya (IL); Anton Rozen, Gedera (IL); Yaakov Seidenwar, Netanya (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/989,288

(22) PCT Filed: Dec. 17, 2010

(86) PCT No.: PCT/IB2010/055910
§ 371 (c)(1),
(2), (4) Date: May 23, 2013

(87) PCT Pub. No.: WO2012/080788
PCT Pub. Date: Jun. 21, 2012

(65) Prior Publication Data
US 2013/0249616 A1 Sep. 26, 2013

(51) Int. Cl.
*H03L 5/00* (2006.01)
*H03K 5/08* (2006.01)
*H03K 19/0185* (2006.01)
*G11C 5/14* (2006.01)

(52) U.S. Cl.
CPC ........ *H03K 19/018507* (2013.01); *G11C 5/147* (2013.01)
USPC .......... 327/319; 327/309; 327/324; 327/544; 326/31; 326/32; 326/33; 326/34

(58) Field of Classification Search
USPC ........ 327/309, 319, 324, 544; 326/31, 32, 33, 326/34
See application file for complete search history.

(56) References Cited

U.S. PATENT DOCUMENTS

| | | | |
|---|---|---|---|
| 5,969,514 A * | 10/1999 | Merrill | 323/283 |
| 2006/0244512 A1 | 11/2006 | Fung et al. | |
| 2008/0111534 A1 | 5/2008 | Ravichandran | |
| 2008/0136507 A1 | 6/2008 | Kim et al. | |
| 2009/0039952 A1 | 2/2009 | Wang et al. | |
| 2009/0115256 A1 | 5/2009 | Flynn et al. | |

OTHER PUBLICATIONS

International Search Report and Written Opinion correlating to PCT/IB2010/055910 dated Oct. 21, 2011.
Sofer Sergey, et al: "Fast and Noise-Aware Power-Up for On-Die Power Gated Domains", Microwaves, Communications, Antennas and Electronics Systems, 2009. COMCAS 2009. IEEE International Conference on Nov. 9-11, 2009, pp. 1-5.

* cited by examiner

*Primary Examiner* — John Poos

(57) ABSTRACT

There is disclosed a switching arrangement comprising a switch with a plurality of individually controllable elementary switches connected in parallel between a first supply rail and a second supply rail. Each of the elementary switches can be in either one of a closed state and an open state independently of the others. A controller is adapted to dynamically control the closing or opening of the elementary switches, depending on the intensity of a current flowing through the switch. The number of elementary switches in the closed state is variable. The higher is the intensity of the current, the higher the number of elementary switches in the closed state. Thus, the impedance of the switch decreases when the current increases, and vice versa, and the voltage drop across the switch may be kept substantially constant.

20 Claims, 2 Drawing Sheets

SWITCHING ARRANGEMENT, INTEGRATED CIRCUIT COMPRISING SAME, METHOD OF CONTROLLING A SWITCHING ARRANGEMENT, AND RELATED COMPUTER PROGRAM PRODUCT

FIELD OF THE INVENTION

This invention relates to a switching arrangement, an integrated circuit comprising such a switching arrangement, a method of controlling a switching arrangement, and a related computer program product.

BACKGROUND OF THE INVENTION

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Modern Integrated Circuits (ICs), for instance ICs used in mobile devices, require a high operating frequency as well as a low current leakage in standby mode, which leads to intensive usage of a power gating techniques. Power gating is a technique that uses low-leakage MOS transistors, also called sleep transistors, as switches to shut off the power supply to internal circuitry parts of an IC in standby or sleep mode, to reduce the stand-by and/or leakage power of the IC. Implementation of power gating relies on an on-chip power switch arranged between the supply voltage source and the power gated circuitry, which creates an additional voltage drop.

Increasing the voltage of the voltage source cannot be considered as a solution for compensating for the voltage drop, since at low current, the voltage drop would tend to zero and the junction voltage may thus become higher than the maximum voltage allowed by the manufacturing process of the functional blocks in the power gated domain.

The power switch needs therefore to be large in order to minimize this voltage drop, since large gate transistors offer smaller impedance and thus lower voltage drop for a given current flowing through the switch. This, however, has a significant die area impact, and also increases leakage through the switch itself. Hence, the IC designer must find a balance between minimizing the voltage drop, and increasing the die area and leakage on the power gating switch.

US patent application publication 2006/0244512 A1 to ATI Technologies Inc. discloses an apparatus and method for matching voltages between two or more circuits within an integrated circuit. The apparatus includes a comparator circuit, comparing supply voltages to first and second circuits. The comparator outputs a variable error voltage based on the comparison, the error voltage relating to the difference in voltages. The error voltage is supplied to a variable current control circuit that variably sinks one of the supply voltages to a common potential in order to increase the IR drop in the circuit supplying voltage to one of the first and second circuits, thereby affording voltage adjustment in order to match the first and second circuits. Such voltage adjustment technique is however not optimal for mobile IC's.

US patent application 2008/0111534 A1 to Intel Inc. discloses a voltage regulator architecture for an integrated circuit. The described apparatus comprise a power switch array having multiple pass transistors, a voltage regulator array having multiple voltage regulators each coupled to a subset of the pass transistors, a subsystem circuit array having multiple subsystem circuits each coupled to a subset of the pass transistors, and a power management control unit coupled to the pass transistors and the voltage regulators. The power management control unit may be arranged to control the pass transistors and voltage regulators to provide different amounts of power to the subsystem circuits.

One could also consider changing the voltage level on the gate of the power switch transistor, like in analog gate-biasing techniques, but implementing such a technique for keeping the voltage drop constant over all the current variation range proves to be very difficult in practice.

SUMMARY OF THE INVENTION

The present invention provides a switching arrangement, an integrated circuit comprising such a switching arrangement, a method of controlling a switching arrangement, and a related computer program product as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

A power gating switch is typically implemented by a sleep power transistor placed in a stack between a functional block of the IC and either a positive supply or ground which supplies the functional block, thus creating a virtual positive supply rail or a virtual ground rail, respectively. Switching off the sleeping transistor when the functional block is in a standby mode allows reducing the standby and/or leakage power consumption of the IC.

Figure 1:
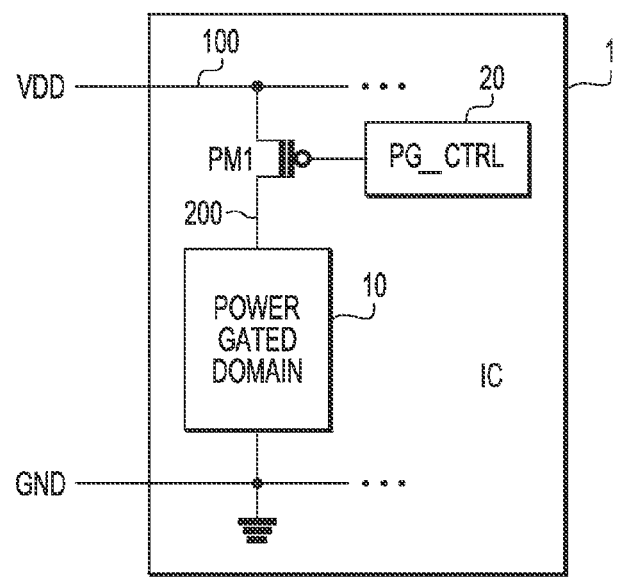
FIG. 1 schematically shows an example of a so-called "footer switch" configuration of a power gating MOS transistor.
Figure 2:
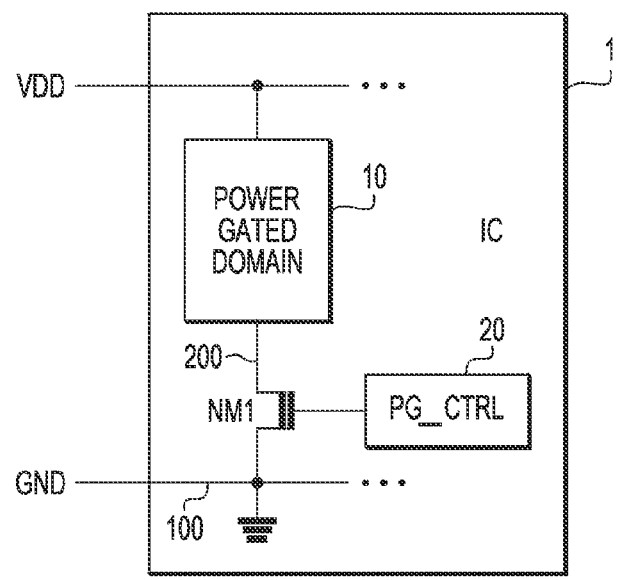
FIG. 2 schematically shows an example of a so-called "footer switch" configuration of a power gating MOS transistor.

With reference to FIG. 1 and FIG. 2, there is shown therein an integrated circuit 1 comprising a first supply rail 100, and a second supply rail or virtual supply rail 200.

A circuitry 10, typically a functional (logic) block of the IC, is supplied by the second supply rail 200. A power gating switch or sleeping power transistor is arranged between the first supply rail and the second supply rail to shut off power supply from the first supply rail to the circuitry 10.

As shown in FIG. 1, the first supply rail 100 may be a positive supply rail, and the second supply rail 200 is thus a virtual positive supply rail. In such application, the power gating switch is called a "header switch" and is typically realised as a PMOS transistor, PM1.

In a variant illustrated by FIG. 2, the first supply rail 100 may be a ground rail and the second supply rail 200 is thus a virtual ground rail. In this case, the power gating switch is called a "footer switch" and, typically, it is a NMOS transistor, NM1.

In both cases of FIG. 1 and FIG. 2, the power gating or sleep transistor splits the IC's supply network into a permanent supply network connected to the first supply rail 100 and a virtual supply network that drives a load consisting of the IC parts connected to the second supply rail 200. These IC parts form a power gated domain 10 which can be turned off by turning off the power gating switch, so as to limit leakage current in their standby mode.

According to embodiments of the present invention, it is proposed to replace the sleeping transistor PM1 or NM1 of FIG. 1 or FIG. 2, respectively, by a switch 11 comprising a plurality of individually controllable elementary switches connected in parallel between the first supply rail 100 and the second (virtual) supply rail 200, each of said elementary switches being in either one of a closed state and an open state. The arrangement further comprises a controller adapted to dynamically control the closing or opening of the elementary switches, depending on the intensity of a current flowing through the switch 10, here from the first rail 100 to the second rail 200. Thus, the number of elementary switches in the closed state is variable. More precisely, the higher is the intensity of the current, the higher the number of elementary switches in the closed state.

The underlying management scheme is to control the impedance of the power gating switch 11, depending on the current going through said switch, so as to keep the voltage drop constant, namely as constant as possible over the load current variation range. If the current is high, then more elementary transistors are enabled in order to decrease the impedance and thus offset the higher current running through the overall switch. If the current is low, on the contrary, then less transistors will be enabled in order to increase the impedance of the overall switch. This way, the voltage drop across the power gating power switch will remain substantially constant, i.e., independent of the current, in order to keep the junction voltage constant.

Figure 3:
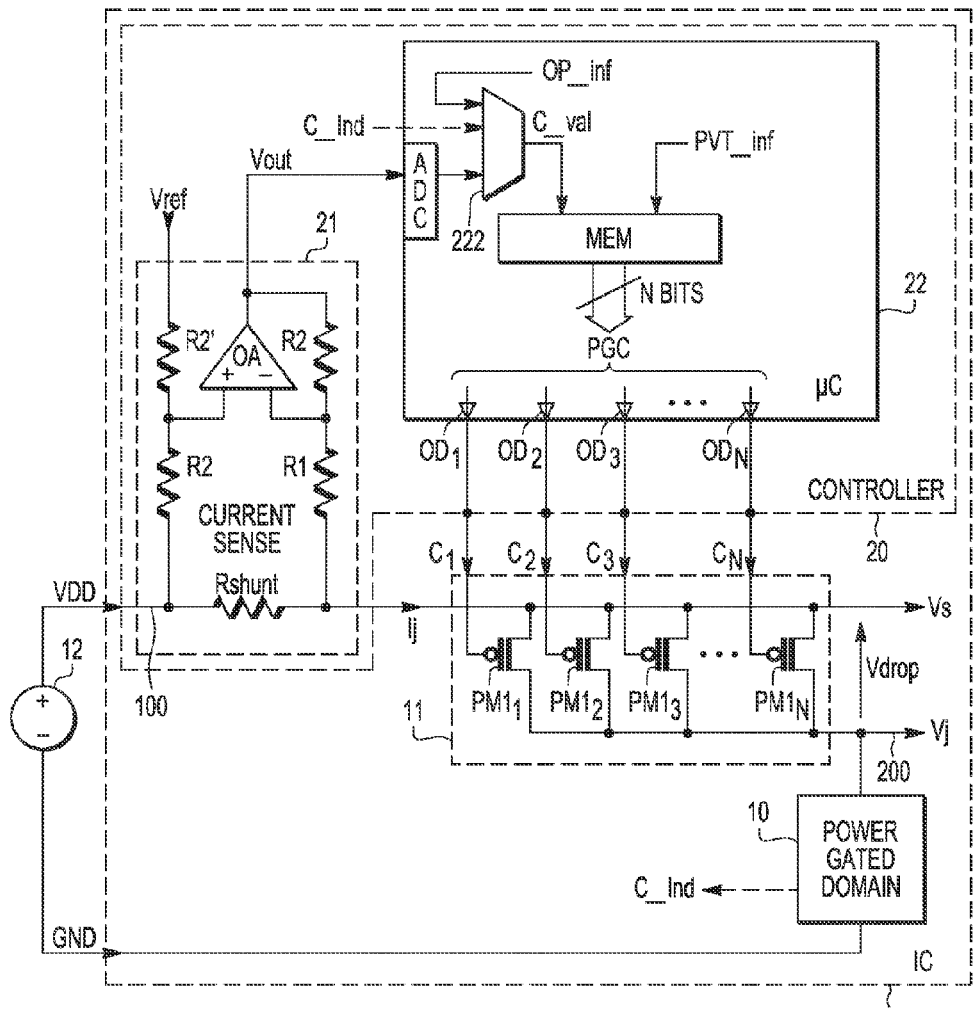
FIG. 3 schematically shows an example of an integrated circuit with a switching arrangement according to embodiments of the present invention.

With reference to FIG. 3, there will now be described an example of implementation of a header switch, being duly noted that the invention is not limited to a header switch but also encompasses footer switch configurations.

The power gating switching arrangement of FIG. 3 comprises switch 11 with a number N of elementary switches, where N is an integral number. In an embodiment, each of the elementary switches comprises a PMOS transistor, $PM1_1$ to $PM1_N$. These transistors are individually controllable elementary switches connected in parallel between the positive supply rail 100 and the virtual positive supply rail 200. The rail 100 is supplied by a voltage source 12, e.g. external to the IC. Each of the elementary switches can be in either one of a closed state and an open state independently of the others. The arrangement further comprises a controller 20 adapted to dynamically control the closing or opening of the elementary switches, depending on the intensity of a current Ij flowing through the switching arrangement, here from rail 100 to rail 200.

For example, the number of elementary switches comprised in the switch 11 may be N=8, N=16, N=32, N=64, etc. The more elementary switches, the more constant the voltage drop may be kept over a given range of variation of the load current.

In some embodiments, the information as to the value of the current Ij can be fed back from the functional block 10. It can also be provided from the external of the IC, when the application has the ability to measure the current sunk from the voltage source 12 which supplies the rail 100.

In the embodiment illustrated by FIG. 3, however, this information is generated by direct observation of the current Ij flowing through switch 11.

For instance, the controller 20 may comprise a current-sense block 21 adapted to generate a current-sense value Vout representative of the intensity of the current flowing through switch 11.

In one example, the current-sense block 21 comprises a shunt resistor Rshunt arranged in the current path between the first supply rail 100 and the second supply rail 200, and a shunt resistor current measurement circuitry which is coupled to said shunt resistor. More precisely, block 21 is adapted to monitor the current flow by measuring the voltage drop across the shunt resistor Rshunt placed in the current path. The shunt resistor current measurement circuitry may output either a voltage or a current that is proportional to the current thus measured through the shunt resistor. Other technologies exist, such as magnetic (using for instance a Hall Effect sensor) and could be used instead of the shunt resistor, but there will be only described embodiments limited to shunt resistor current measurement.

In one embodiment, the shunt resistor current measurement circuitry of the current-sense block 21 may comprise a simple subtractor or difference amplifier with Common Mode Rejection (CMR), as shown in FIG. 3. Such difference amplifier can be constructed with four resistors R1, R2, R1' and R2' and an Operational Amplifier (OA) as shown. It operates as a differential input single output current-to-voltage converter, which outputs a output voltage Vout proportional to the current flowing in the supply rail, which is referenced to a reference voltage Vref. Differential inputs of the difference amplifier are respectively coupled to the terminals of the shunt resistor, to measure the voltage drop across the shunt resistor. The output of the difference amplifier delivers the current-sense value Vout. Preferably, Vref may be the ground voltage, so that the output voltage Vout of the current-sense amplifier is a ground-referenced voltage.

The output voltage Vout is given by:

$$V\text{out}=(V2-V1)\cdot R2/R1 \qquad (1)$$

For high CMR, the ratio between the resistors is preferably such that:

$$R2'/R1'=R2/R1 \qquad (2)$$

Indeed, the CMR is primarily determined by the resistor ratio matching, not by the characteristics of the OA. The resistor ratios R1/R2 and R1'/R2' must match extremely well to reject common mode noise, i.e., at least as well as a typical operational amplifier CMR of more than 100 dB. The absolute resistor values are relatively unimportant.

To summarize, the current-sense block 21 has a voltage difference amplifier cooperating with the current-sense resistor or shunt resistor Rshunt, which is placed in series in the supply rail 100, to convert the load current Ij in the supply rail to a small voltage, which is then amplified by the difference amplifier. Resistor Rshunt can be as low as 0.1 ohm, for instance.

The controller further comprise a switch control block 22 adapted to generate control signals $C_1$ to $C_N$ controlling the state of the elementary switches $PM1_1$ to $PM1_N$, respectively, responsive to said current-sense value Vout.

In one embodiment, the switch control block 22 comprises a microcontroller (μC), like a MPIC for instance. The microcontroller may generate the control signals $C_1$-$C_N$) controlling the state of the elementary switches responsive directly to an analog-to-digital converted version of the current-sense value Vout.

Alternatively, however, the switch control block 22 may be adapted to generate a current value information C_val based on the current sense value Vout and on at least one additional information OP_inf. This additional information may comprise at least one of operation mode information and frequency of operation information, so that their effect on the switch impedance may be accounted for. To this end, the current-sense value Vout may be analog-to-digital converted user an input Analog-to-Digital Converter (ADC) of the microcontroller. Logical combination of the analog-to-digital converted current-sense value Vout and of the additional information OP_inf is symbolized by a logic 222 inside the microcontroller. In a variant, this combination may be realized outside the microcontroller. It may be part of the current-sense block 21, and/or it may be obtained in the analog domain. In both cases, the microcontroller generates the control signals $C_1$-$C_N$ responsive to the current value information C_val.

The switch control block 21 may comprise a coding table adapted to output, responsive to at least the current value information C_val, a control value PGC on N bits, where N is the number of elementary switches to be controlled. Each of the N bits of the binary word PGC may advantageously correspond to a respective one of the control signals $C_1$ to $C_N$. These control signals drive the gate terminal of PMOS transistors $PM1_1$ to $PM1_N$, respectively, through output drivers $OD_1$ to $OD_N$, respectively, of the microcontroller. Thus, a control signal with low logical value closes the associated elementary switch, since the PMOS transistor is rendered conductive. On the contrary, high logical value of a control signal is responsible for the closing of the associated switch, since the PMOS transistor is set in the blocked, i.e., non conductive state.

The coding table may be stored in the internal memory of the microcontroller. This memory can be of any type of non volatile memory technology, e.g., EPROM, EEPROM, Flash-ROM, UVPROM, NVRAM, etc.

In some embodiments, the coding table may output the control value PGC responsive to at least one further additional information. This information may comprise manufacturing process information PVT_inf associated with the elementary switches (e.g. information representative of the impedance characteristics of the elementary switches steered by their manufacturing process), operating voltage information, and operating temperature information. At least some of these additional information may be define off-line, that is to say, e.g. during the IC manufacturing. They may thus be stored in additional non volatile storage of the microcontroller. Alternatively, some of all the additional information may be obtained in-line, that is to say, during operation of the IC, by direct observation or computation of some internal values or parameters.

The coding table is adapted to maintain the voltage drop Vdrop across the switch 11 substantially constant over the operational current intensity variation range. The voltage drop Vdrop is defined by the difference between the voltage Vs of the supply rail 100 and the (lower) voltage Vj on the virtual supply rail 200, and stems from the conduction voltage Vds of the power MOS transistors $PM1_1$ to $PM1_N$, which form the elementary switches.

As the one with ordinary skills in the art will not fail to identify, however, this result is not achieved by a closed loop system that would regulate Vdrop based with feedback on the value of Vs and Vj. Instead, the proposed approach offers an open loop solution which relies on the calculation of the appropriate number of elementary switches or transistors which are in the closed state at a time, so as to adapt the overall switch impedance to the value of the current that flows through the switch, whereby a substantially constant voltage drop is achieved.

In a variant, the controller 22 is adapted to receive a current value indication C_ind from the functional block 10, i.e. from at least one module of the power gated domain, which is coupled to the virtual supply rail 200. This current value indication C_ind may be used instead of the current-sense value Vout. Schematically, FIG. 3 shows this current value indication C_ind received as input on the logic 222 of the microcontroller. Such indication may be bound to the activity of module 10, and relate to such characteristics as its frequency of operation, mode of operation, etc.

This embodiment may prove advantageous when additional voltage drop on the power switch 11 may be caused by other resistive element on the elementary transistors' grid path, that would make current sense unreliable.

Of course, some embodiments may combine the current-sense value Vout obtained by the current sense block 21 and the current value indication C_ind received from the power gated module 10.

Figure 4:
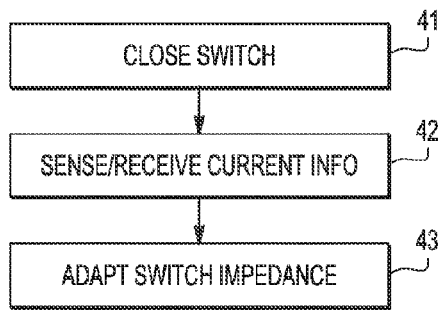
FIG. 4 is a flow chart diagrammatically showing steps of a method of controlling a switching arrangement according to embodiments of the invention.

Referring to FIG. 4, an example of a method of controlling the switching arrangement will now be presented.

At step 41, an intermediate number of the elementary switches are, among the plurality of N individually controllable elementary switches of the switching arrangement closed so as to close the switch 11 of FIG. 3. In one embodiment, this intermediate number is at least equal to unity, and is preferably equal or close to N/2 or N/3. Hence, the impedance of the switch is initially set to approximately the half or the third, respectively, of the available dynamic range. This intermediate number may be a parameter stored in a register of the microcontroller 22.

At step 42, the intensity of the current flowing through the switching arrangement is sensed by the current-sense block 21, as it has been described in details above in respect of FIG. 3. In the variant, the current value indication C_ind is received from the block 10 supplied by rail 200, so that control signals $C_1$-$C_N$ controlling the state of the elementary switches can be generated responsive to the current value indication.

At step 43, the closing of further elementary switch, or the opening of some (but not all) of the elementary switches which are in the closed state, is dynamically controlled as a function of the sensed intensity of the current flowing through the switch or as a function of the current value indication C_ind associated with said current, so as to adapt the switch impedance. The number of elementary switches in the closed state is allowed to vary according to the following rule: the higher the intensity of the current, the higher the number of elementary switches in the closed state. Thanks to the translation by the coding table, the voltage drop across the switching arrangement is maintained substantially constant over the operational current intensity variation range. Namely, if current Ij through the switch increases, then the number of closed elementary switches is increased, so as to reduce the overall impedance Rsw of the switch. On the contrary if current Ij decreases, then the number of closed elementary switches is reduced, so as to increase the overall impedance Rsw of the switch. Thus, the voltage drop Vdrop=Ij×Rsw may be kept substantially constant. Again, this result may be achieved by implementing one of the embodiments which have been described in detail above in respect of FIG. 3.

In particular, generating the current value information C_val based on the current value indication C_ind or on the current sense value Vout and based further on at least one of the additional information OP_inf, and generating the control signals $C_1$-$C_N$ responsive to said current value information, allows accounting for electrical phenomena which influence the impedance of the elementary switches and, in turn, the voltage drop across the switch.

Also, using a coding table adapted to output the control value PGC responsive not only to current value information C_val but also on at least one of:

manufacturing process information associated with the elementary switches;
operating voltage information; and,
operating temperature information, allows compensating electrical phenomena which influence the impedance of the elementary switches and, in turn, the voltage drop across the switch.

The various examples hereinbefore described and illustrated in the accompanying drawings may provide at least one of the following:

this approach allows having high operating voltage on the power gating transistor, yielding in voltage drop initially higher than what is allowed in today's ICs, since the voltage drop is compensated by the dynamic power switch;
this approach saves both area and leakage of the power switch; and,
since the controller is implemented in the IC, a cheaper external power supply source can be used, which saves the bill of materials (BOM) for the customer.

At least some aspects of the invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non volatile memory storage media including semiconductor-based memory units such as FLASH memory, EEPROM, EPROM, ROM; ferromagnetic digital memories; MRAM; volatile storage media including registers, buffers or caches, main memory, RAM, etc.; just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the composition of the current-sense block 21 and of the switch control block 22 may be modified without departing from the scope of the present invention.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the current-sense block 21 and/or the switch control block 22 may be implemented by means external to the IC. Alternatively, the examples may be implemented as any number of separate integrated circuits or separate devices interconnected with each other in a suitable manner. For example, at least part of the functions which, in the described embodiments, have been presented as being implemented in the microcontroller may also be split among different logic and/or analog blocks.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A switching arrangement, comprising:
   a switch comprising a plurality of individually controllable elementary switches connected in parallel between a first supply rail and a second supply rail, each of said elementary switches being in either one of a closed state and an open state independently of the others; and
   a controller adapted to dynamically control the closing or opening of the elementary switches, depending on the intensity of a current flowing through the switch, wherein the number of elementary switches in the closed state is variable and wherein the higher is the intensity of the current the higher the number of elementary switches in the closed state, wherein the controller comprises a current-sense block adapted to generate a current-sense value representative of the intensity of the current flowing through the switch.

2. The switching arrangement of claim 1, wherein the controller is further adapted to receive, from a load supplied by the second supply rail, a current value indication representative of the intensity of the current flowing through the switch, and to control the closing or opening of the elementary switches responsive to said current value indication.

3. The switching arrangement of claim 1, wherein the current-sense block comprises a shunt resistor arranged in the current path between the first voltage rail and the second voltage rail, and a shunt resistor current measurement circuitry which is coupled to said shunt resistor.

4. The switching arrangement of claim 3, wherein the shunt resistor current measurement circuitry comprises a differential amplifier having differential inputs respectively coupled to shunt resistor terminals to measure the voltage drop across the shunt resistor, and at least one output delivering the current-sense value.

5. The switching arrangement of claim 1, wherein the controller further comprises a switch control block adapted to generate control signals controlling the state of the elementary switches responsive to a current value indication and/or the current-sense value.

6. The switching arrangement of claim 5, wherein the switch control block is adapted to generate a current value information based on the current value indication and/or the current-sense value, and based further on at least one additional information among operation mode information and frequency of operation information.

7. The switching arrangement of claim 5, wherein the switch control block comprises a coding table adapted to output, responsive to at least the current value indication and/or the current-sense value or responsive to the current value information a control value on N bits, where N is the number of elementary switches to be controlled, each of which corresponding to a respective one of the control signals.

8. The switching arrangement of claim 7, wherein the coding table is further adapted to output the control value responsive, further, to at least one of additional information among information comprising:
    manufacturing process information associated with the elementary switches;
    operating voltage information; and
    operating temperature information.

9. The switching arrangement of claim 7, wherein the coding table is adapted to maintain the voltage drop across the switch substantially constant over an operational current intensity variation range.

10. The switching arrangement of claim 7, wherein the switch control block comprises a microcontroller and wherein the coding table is stored in a memory of said microcontroller.

11. An integrated circuit comprising:
    a first supply rail and a second supply rail;
    a circuitry supplied by the second supply rail; and,
    a power gating switch, arranged between the first voltage rail and the second voltage rail to shut off power supply from the first supply rail to the circuitry, the power gating switch includes a switching arrangement including:
        a switch comprising a plurality of individually controllable elementary switches connected in parallel between a first supply rail and a second supply rail each of said elementary switches being in either one of a closed state and an open state independently of the others; and
        a controller adapted to dynamically control the closing or opening of the elementary switches, depending on the intensity of a current flowing through the switch, wherein the number of elementary switches in the closed state is variable and wherein the higher is the intensity of the current the higher the number of elementary switches in the closed state, wherein the controller comprises a current-sense block adapted to generate a current-sense value representative of the intensity of the current flowing through the switch.

12. The integrated circuit of claim 9, wherein the first supply rail is a positive supply rail and the second supply rail is a virtual positive supply rail, and wherein each of the elementary switches comprises a PMOS transistor.

13. The integrated circuit of claim 1, wherein the first supply rail is a ground rail and the second supply rail is a virtual ground rail, and wherein each of the elementary switches comprises a NMOS transistor.

14. A method of controlling a switching arrangement comprising:
    closing an intermediate number of elementary switches among a plurality of individually controllable elementary switches of a switch, which are connected in parallel between a first supply rail and a second voltage rail, each of said elementary switches being in either one of a closed state and an open state independently of the others;
    sensing the intensity of a current flowing through the switch between the first supply rail and the second supply rail;
    generating a current-sense value representative of the intensity of the current flowing through the switch by measuring a voltage drop across a shunt resistor arranged in the current path between the first voltage rail and the second voltage rail;
    generating control signals controlling the state of the elementary switches responsive to the current-sense value; and
    dynamically controlling the closing or opening of the elementary switches, depending on the control signals, wherein the number of elementary switches in the closed state is variable and wherein the higher is the intensity of the current the higher the number of elementary switches in the closed state.

15. The method of claim 14, further comprising:
    receiving a current value indication from a load supplied by the second supply rail; and
    generating control signals controlling the state of the elementary switches responsive to the current value indication.

16. The method of claim 14, further comprising generating a current value information based on the current value indication and/or the current-sense value, and based further on at least one additional information among operation mode information and frequency of operation information, and generating the control signals controlling the state of the elementary switches responsive to said current value information.

17. The method of claim 14, wherein generating the control signals controlling the state of the elementary switches comprises using a coding table which outputs, responsive to at least the current value indication and/or the current-sense value, or responsive to the current value information, a control value on N bits, where N is the number of elementary switches of the switch to be controlled, each of which bits corresponding to a respective one of the control signals.

18. The integrated circuit of claim 11, wherein the current-sense block comprises a shunt resistor arranged in the current path between the first voltage rail and the second voltage rail, and a shunt resistor current measurement circuitry which is coupled to said shunt resistor.

19. The integrated circuit of claim 11, wherein the controller further comprises a switch control block adapted to generate control signals controlling the state of the elementary switches responsive to the current value indication and/or the current-sense value.

20. The integrated circuit of claim 19, wherein the shunt resistor current measurement circuitry comprises a differential amplifier having differential inputs respectively coupled to shunt resistor terminals to measure the voltage drop across the shunt resistor, and at least one output delivering the current-sense value.

* * * * *